US012598772B2

(12) United States Patent
Kim et al.

(10) Patent No.:    US 12,598,772 B2
(45) Date of Patent:       Apr. 7, 2026

(54) VERTICAL TRENCH GATE FET WITH SPLIT GATE

(71) Applicant: TEXAS INSTRUMENTS INCORPORATED, Dallas, TX (US)

(72) Inventors: Sunglyong Kim, Allen, TX (US); Seetharaman Sridhar, Richardson, TX (US); Meng-Chia Lee, Allen, TX (US); Thomas Eugene Grebs, Bethlehem, PA (US); Hong Yang, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/147,875

(22) Filed: Jan. 13, 2021

(65) Prior Publication Data

US 2022/0223731 A1     Jul. 14, 2022

(51) Int. Cl.
*H10D 30/66*        (2025.01)
*H01L 21/765*       (2006.01)
(Continued)

(52) U.S. Cl.
CPC ......... *H10D 30/668* (2025.01); *H01L 21/765* (2013.01); *H01L 23/4824* (2013.01);
(Continued)

(58) Field of Classification Search
CPC ............... H01L 29/7813; H01L 29/407; H01L 29/4238; H01L 23/4824; H10D 64/513;
(Continued)

(56) References Cited

U.S. PATENT DOCUMENTS 9,299,830 B1 *   3/2016   Kawahara ............ H10D 64/513
2012/0025874 A1 *   2/2012   Saikaku ................ H01L 29/407
257/330

(Continued)

OTHER PUBLICATIONS

Chang, Mo-Huai et al. "Optimizing the Trade-off Between the RDS(on) of Power MOSFETs and Linear Mode Performance by Local Modification of MOSFET Gain." Proceedings of the 2016 28th International Symposium on Power Semiconductor Devices and ICs (ISPSD), Jun. 12-16, 2016, Prague, Czech Republic, pp. 379-382.

*Primary Examiner* — Samuel A Gebremariam
*Assistant Examiner* — Jonas T Beardsley
(74) *Attorney, Agent, or Firm* — Andrew R. Ralston; Frank D. Cimino

(57)          ABSTRACT

A semiconductor device includes first, second and third trenches formed in a semiconductor layer having a first conductivity type. Each trench includes a corresponding field plate and a corresponding gate over each field plate. A first body region having a second opposite conductivity type is between the first and second gates, and a second body region having the second conductivity type is located between the second and third gates. A first source region is located over the first body region and a second source region is located over the second body region, the first and second source regions having the first conductivity type. A first gate bus is conductively connected to the first gate and a second gate bus is conductively connected to the second gate, the first gate bus conductively isolated from the second gate bus.

19 Claims, 9 Drawing Sheets

(51) Int. Cl.

| | | |
|---|---|---|
| *H01L 23/482* | (2006.01) | |
| *H10D 30/01* | (2025.01) | |
| *H10D 62/10* | (2025.01) | |
| *H10D 62/17* | (2025.01) | |
| *H10D 64/00* | (2025.01) | |

(52) U.S. Cl.

CPC ....... *H10D 30/0297* (2025.01); *H10D 62/127* (2025.01); *H10D 62/393* (2025.01); *H10D 64/117* (2025.01)

(58) Field of Classification Search

CPC .. H10D 64/117; H10D 62/127; H10D 30/668; H10D 64/519

See application file for complete search history.

(56) References Cited

U.S. PATENT DOCUMENTS

| | | | | |
|---|---|---|---|---|
| 2017/0250269 A1* | 8/2017 | Sumitomo | ............ | H01L 29/407 |
| 2017/0278837 A1* | 9/2017 | Hsieh | ................. | H01L 29/7805 |
| 2018/0226481 A1* | 8/2018 | Wutte | ................. | H10D 64/117 |
| 2018/0331210 A1* | 11/2018 | Mori | ................... | H10D 30/668 |
| 2019/0296148 A1* | 9/2019 | Tanaka | ............... | H01L 23/4824 |
| 2020/0212219 A1 | 7/2020 | Kim et al. | | |
| 2020/0312710 A1 | 10/2020 | Yang et al. | | |
| 2021/0057574 A1* | 2/2021 | Nishiwaki | ............ | H01L 29/407 |

* cited by examiner

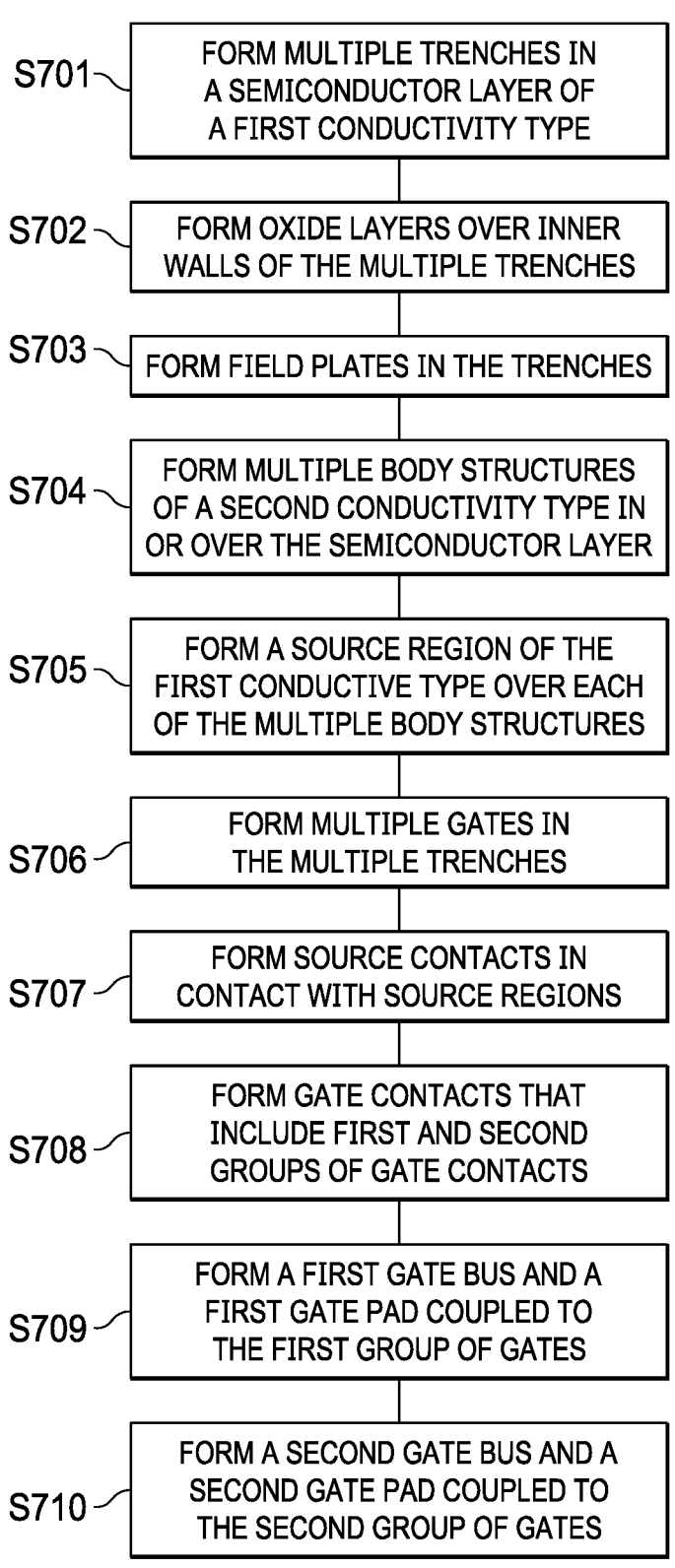

S701 — FORM MULTIPLE TRENCHES IN A SEMICONDUCTOR LAYER OF A FIRST CONDUCTIVITY TYPE

S702 — FORM OXIDE LAYERS OVER INNER WALLS OF THE MULTIPLE TRENCHES

S703 — FORM FIELD PLATES IN THE TRENCHES

S704 — FORM MULTIPLE BODY STRUCTURES OF A SECOND CONDUCTIVITY TYPE IN OR OVER THE SEMICONDUCTOR LAYER

S705 — FORM A SOURCE REGION OF THE FIRST CONDUCTIVE TYPE OVER EACH OF THE MULTIPLE BODY STRUCTURES

S706 — FORM MULTIPLE GATES IN THE MULTIPLE TRENCHES

S707 — FORM SOURCE CONTACTS IN CONTACT WITH SOURCE REGIONS

S708 — FORM GATE CONTACTS THAT INCLUDE FIRST AND SECOND GROUPS OF GATE CONTACTS

S709 — FORM A FIRST GATE BUS AND A FIRST GATE PAD COUPLED TO THE FIRST GROUP OF GATES

S710 — FORM A SECOND GATE BUS AND A SECOND GATE PAD COUPLED TO THE SECOND GROUP OF GATES

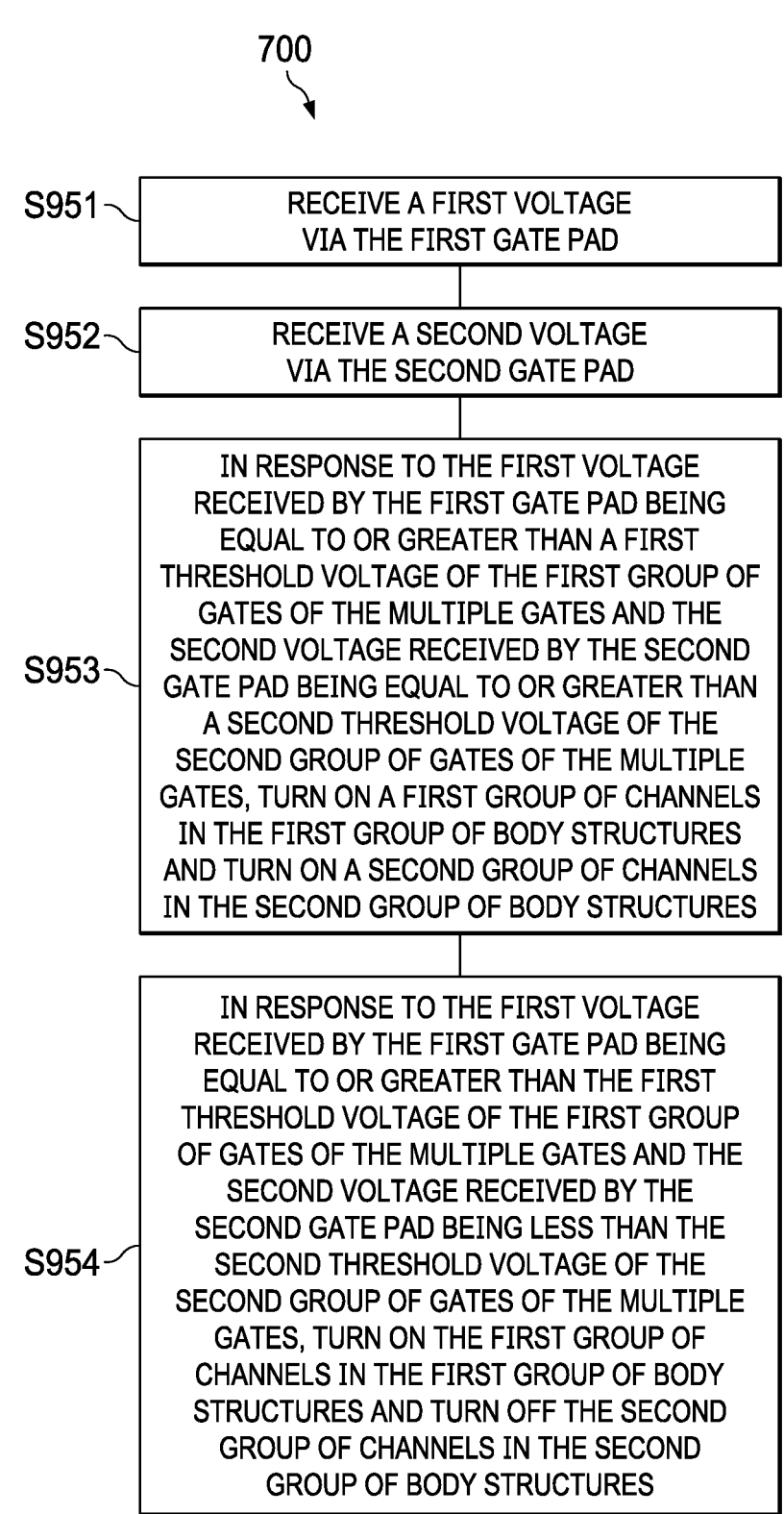

S951 — RECEIVE A FIRST VOLTAGE VIA THE FIRST GATE PAD

S952 — RECEIVE A SECOND VOLTAGE VIA THE SECOND GATE PAD

S953 — IN RESPONSE TO THE FIRST VOLTAGE RECEIVED BY THE FIRST GATE PAD BEING EQUAL TO OR GREATER THAN A FIRST THRESHOLD VOLTAGE OF THE FIRST GROUP OF GATES OF THE MULTIPLE GATES AND THE SECOND VOLTAGE RECEIVED BY THE SECOND GATE PAD BEING EQUAL TO OR GREATER THAN A SECOND THRESHOLD VOLTAGE OF THE SECOND GROUP OF GATES OF THE MULTIPLE GATES, TURN ON A FIRST GROUP OF CHANNELS IN THE FIRST GROUP OF BODY STRUCTURES AND TURN ON A SECOND GROUP OF CHANNELS IN THE SECOND GROUP OF BODY STRUCTURES

S954 — IN RESPONSE TO THE FIRST VOLTAGE RECEIVED BY THE FIRST GATE PAD BEING EQUAL TO OR GREATER THAN THE FIRST THRESHOLD VOLTAGE OF THE FIRST GROUP OF GATES OF THE MULTIPLE GATES AND THE SECOND VOLTAGE RECEIVED BY THE SECOND GATE PAD BEING LESS THAN THE SECOND THRESHOLD VOLTAGE OF THE SECOND GROUP OF GATES OF THE MULTIPLE GATES, TURN ON THE FIRST GROUP OF CHANNELS IN THE FIRST GROUP OF BODY STRUCTURES AND TURN OFF THE SECOND GROUP OF CHANNELS IN THE SECOND GROUP OF BODY STRUCTURES

FIG. 14

VERTICAL TRENCH GATE FET WITH SPLIT GATE

BACKGROUND

Metal-oxide-semiconductor field-effect transistor (MOS-FET) devices have a broad range of applications, such as applications in power management. A safe operating area (SOA) of the MOSFET describes the voltage and current conditions over which the device can be expected to operate without self-damage.

SUMMARY

In one example, a semiconductor device includes first, second and third trenches formed in a semiconductor layer having a first conductivity type. Each trench includes a corresponding field plate and a corresponding gate over each field plate. A first body region having a second opposite conductivity type is between the first and second gates, and a second body region having the second conductivity type is located between the second and third gates. A first source region is located over the first body region and a second source region is located over the second body region, the first and second source regions having the first conductivity type. A first gate bus is conductively connected to the first gate and a second gate bus is conductively connected to the second gate, the first gate bus conductively isolated from the second gate bus.

In another example, a semiconductor device includes a drift region having a first surface. First and second source regions are over the drift region. The first and second source regions are coupled to a source terminal. A first body structure is between the first source region and the drift region. A second body structure is between the second source region and the drift region. A first gate corresponds to the first body structure. A second gate corresponds to the second body structure. The first gate is conductively connected to a first gate bus configured to receive a first voltage. The second gate is conductively connected to a second gate bus configured to receive a second voltage.

In certain examples, a method of forming a semiconductor device includes forming first, second and third trenches in a semiconductor layer of a first conductivity type. The semiconductor layer is over a semiconductor substrate having the first conductivity type. A first oxide layer is formed over a first inner wall of the first trench. A second oxide layer is over a second inner wall of the second trench. A third oxide layer over a third inner wall of the third trench. A first polysilicon plate is formed in the first trench. A second polysilicon plate is formed in the second trench. A third polysilicon plate is formed in the third trench. A first gate is formed over the first polysilicon plate. A second gate is formed over the second polysilicon plate. A third gate is formed over the third polysilicon plate. First and second body structures of a second conductivity type are formed over the semiconductor layer. The first body structure is between the first and second polysilicon plates and the second body structure between the second and third polysilicon plates. A first source region of the first conductivity type is formed over the first body structure. A second source region of the first conductivity type is formed over the second body structure. The first gate is conductively connected to a first gate bus. The second gate is conductively connected to a second gate bus.

BRIEF DESCRIPTION OF THE DRAWINGS

For a detailed description of various examples, reference will now be made to the accompanying drawings in which:

FIG. 9 illustrates a flow chart of an example method for forming an example SG device;

FIG. 14 illustrates a flow chart of another example operation method according to described examples.

DETAILED DESCRIPTION

As technology nodes become smaller while channel densities increase, MOSFET devices may have decreased safe-operating-areas (SOA), and may operate in a thermally unstable region.

The described examples include a split-gate (SG) MOS-FET device having an array of gates split into first and second groups of gates, where the gates in the first group of gates are conductively connected to a first gate bus, and the gates in the second group of gates are conductively connected to a second different gate bus. The first group of gates and the second group of gates can be controlled separately. For example, by turning on the first group of gates and turning off the second group of gates in an array of gates of a FET MOSFET device, the zero-temperature-coefficient (ZTC) point may be decreased, the MOSFET device may have an improved SOA, and the MOSFET device may operate in a thermally stable region.

FIGS. 1-8 illustrate schematic views of various stages of the formation of an example split-gate (SG) device 100; and FIG. 9 illustrates a corresponding flow chart of an example method for forming the example SG device 100. FIGS. 1-8 will now be described along with references to the flow chart of FIG. 9. Additional details of forming some features of the device 100 may be found in U.S. patent application Ser. No. 16/237,210, incorporated by reference herein by reference in its entirety.

Figure 2:
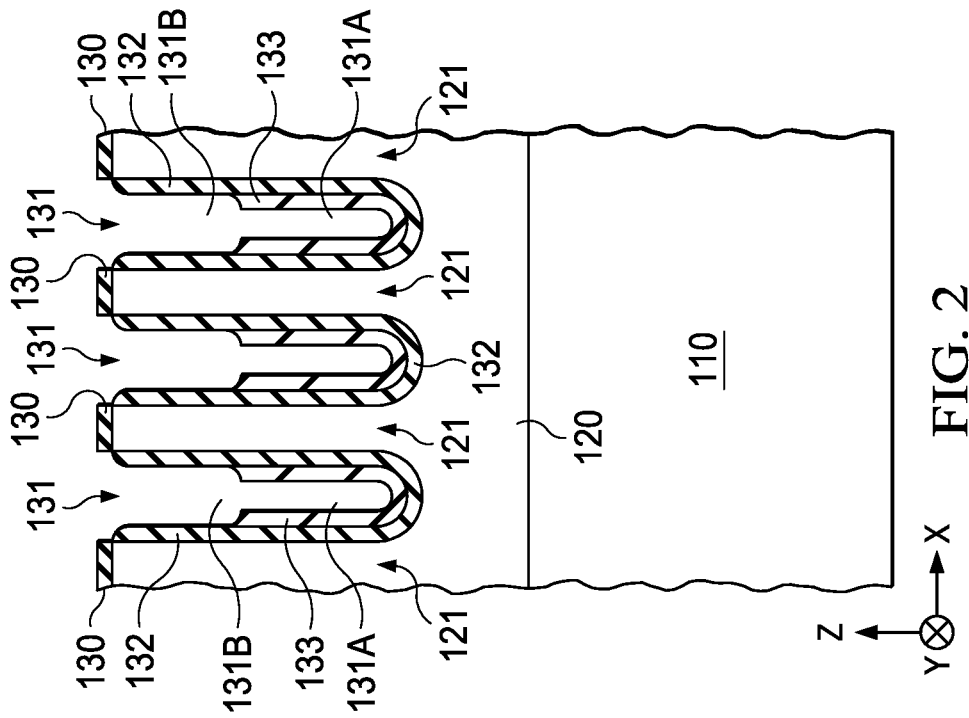
FIGS. 1-8 illustrate schematic views of various stages of the formation of an example split-gate (SG) device according to described examples.
Figure 1:
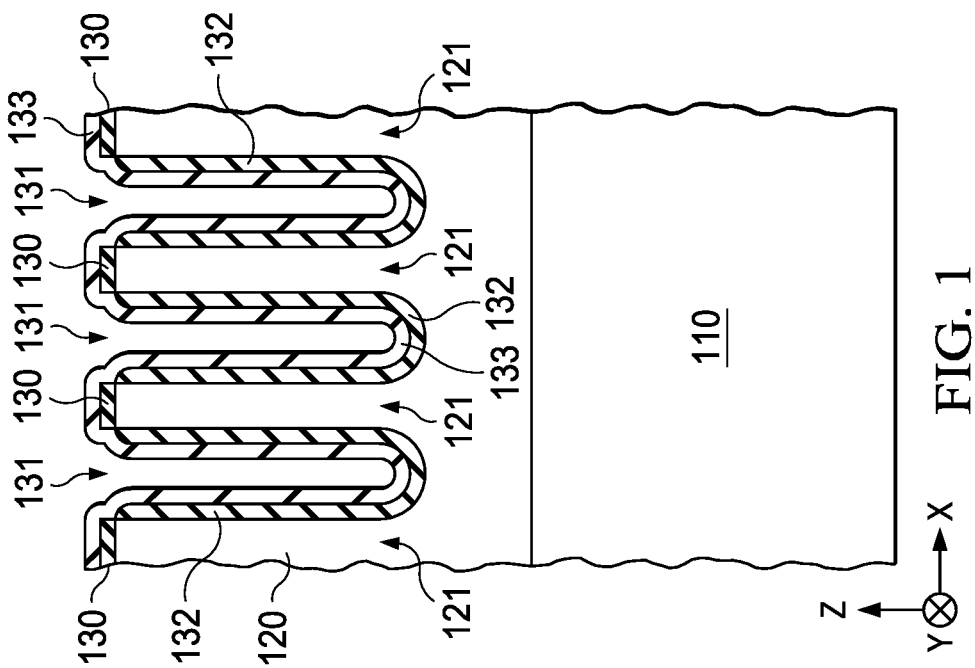

FIGS. 1 and 2 illustrate a semiconductor substrate 110, a semiconductor layer 120 on the semiconductor substrate 110, a nitride layer 130 on the semiconductor layer 120, multiple trenches 131 in the semiconductor layer 120, oxide layers 132 and 133 over the inner walls of the multiple trenches 131. In FIG. 2, the multiple trenches 131 each includes a first portion 131a and a second portion 131b that has a larger dimension (e.g. width) in the plane of the figure than the first portion 131a. The second portion 131b of the trench 131 may be formed by etching away a portion of the oxide layer 133 shown in FIG. 1 with photoresist protecting the oxide layer 133 in the first portion 131a.

FIG. 9 illustrates the corresponding steps as forming multiple trenches in a semiconductor layer of a first conductivity type in step S701 in FIG. 9, and as forming oxide layers over inner walls of the multiple trenches in step S702 in FIG. 9. The first conductivity type may be p-type or n-type. In some examples, the semiconductor substrate 110 is a heavily doped silicon substrate, and the semiconductor layer 120 is a lightly doped epitaxial silicon layer. The multiple trenches 131 may be formed by patterning the silicon nitride layer 130 and by etching the exposed semiconductor layer 120. Accordingly the semiconductor layer 120 includes multiple semiconductor regions 121, each semiconductor region 121 located between two neighboring trenches 131. (FIG. 2.) The etched nitride layer 130 may serve as a hard mask to protect multiple semiconductor regions 121, during the process of etching the semiconductor layer 120 to form the multiple trenches 131. In some examples, the oxide layer 132 is formed by thermal oxidation, and the oxide layer 133 is formed by plasma deposition.

FIGS. 1 and 2 also illustrate a coordinate system including X, Y, and Z axes. The X-axis and the Y-axis are orthogonal to each other and are parallel to a plane of the semiconductor substrate 110. The X and Y-axes are thus referred to as "in-plane direction." The Z-axis is orthogonal to the X and Y-axes and thus orthogonal to the plane of the semiconductor substrate 110. As such, the Z-axis is referred to as an "out-of-plane direction."

Figure 3:
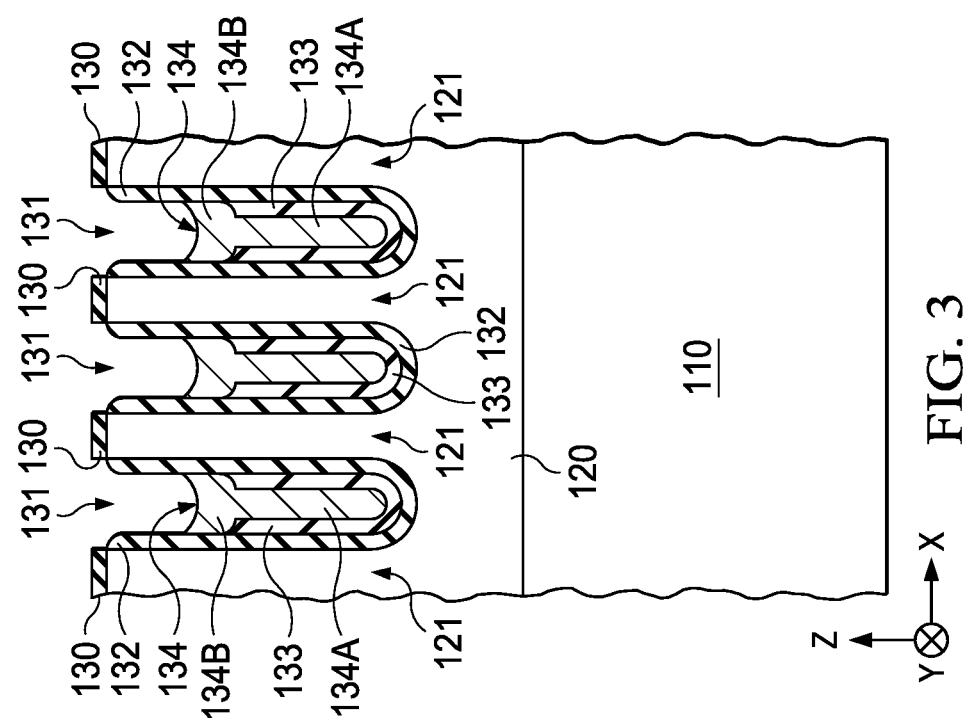

FIG. 3 illustrates multiple field plates 134 in the multiple trenches 131, respectively. FIG. 9 illustrates the corresponding step as forming field plates in the trenches in step S703 in FIG. 9. Each field plate 134 includes a first portion 134a and a second portion 134b that has a greater in-plane extent (e.g., width in the X-direction) than the first portion 134a. The field plates 134 may be formed from a polysilicon layer that is etched back to leave a remaining portion of polysilicon in each trench. In some examples the polysilicon is heavily doped to provide relatively high conductivity.

Figure 4:
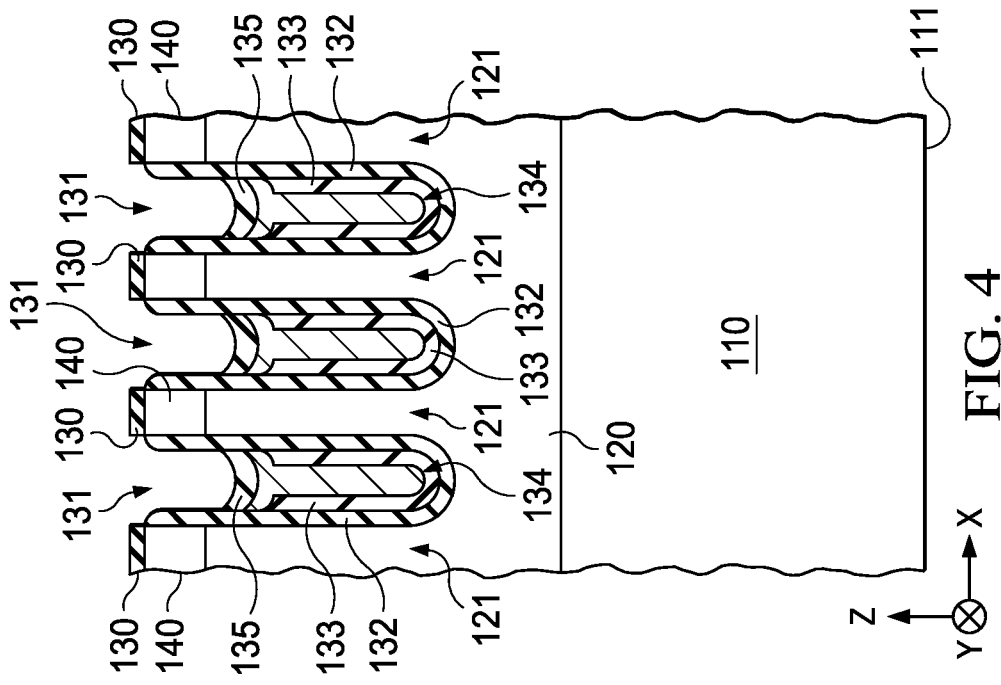

FIG. 4 illustrates an oxide layer 135 over each field plate 134m and multiple body structures 140 of a second conductivity type in/over the semiconductor layer 120. The oxide layer 135 may be formed by thermal oxidation and/or deposition and partial removal of a plasma-based oxide. FIG. 9 illustrates the corresponding step of forming the body structures 140 as forming multiple body structures of a second conductivity type in or over the semiconductor layer 120 in step S704. The multiple body structures 140 may be formed by implanting ion dopants of the second conductivity type into the semiconductor layer 120. In some examples, the first conductivity type is p-type, and the second conductivity type is n-type. In other examples, the first conductivity type is n-type, and the second conductivity type is p-type.

Figure 5:
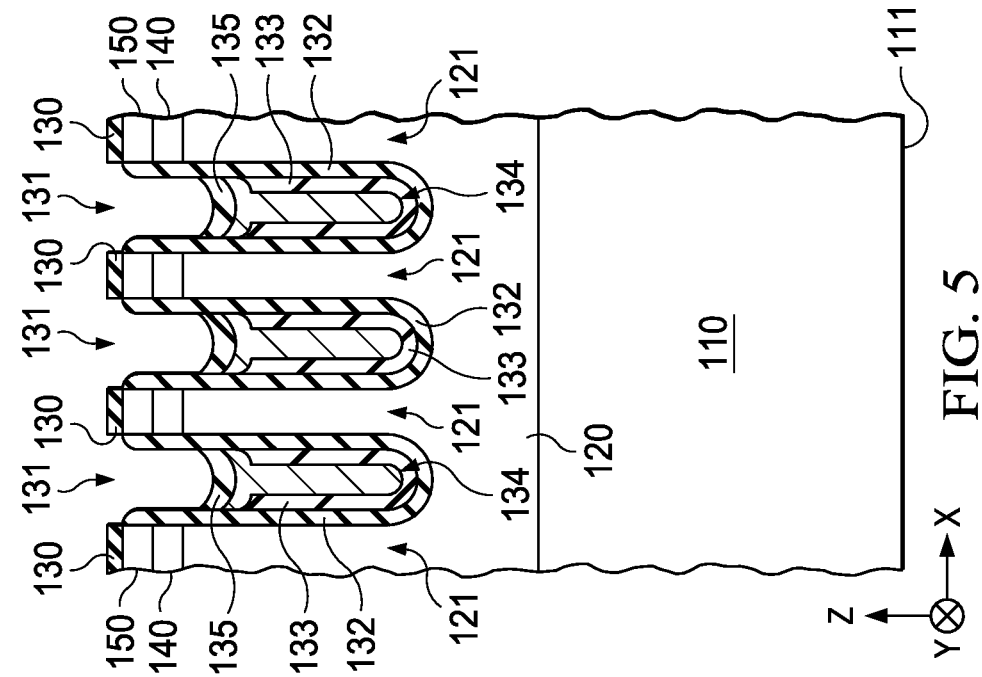

FIG. 5 illustrates multiple source regions 150 of the first conductivity type over the multiple body structures 140 of the second conductivity type. FIG. 9 illustrates the corresponding step as forming a source region of the first conductivity type over each of the multiple body structures in step S705. The source regions 150 may be formed by implanting ion dopants of the first conductivity type into the semiconductor layer 120.

Figure 6:
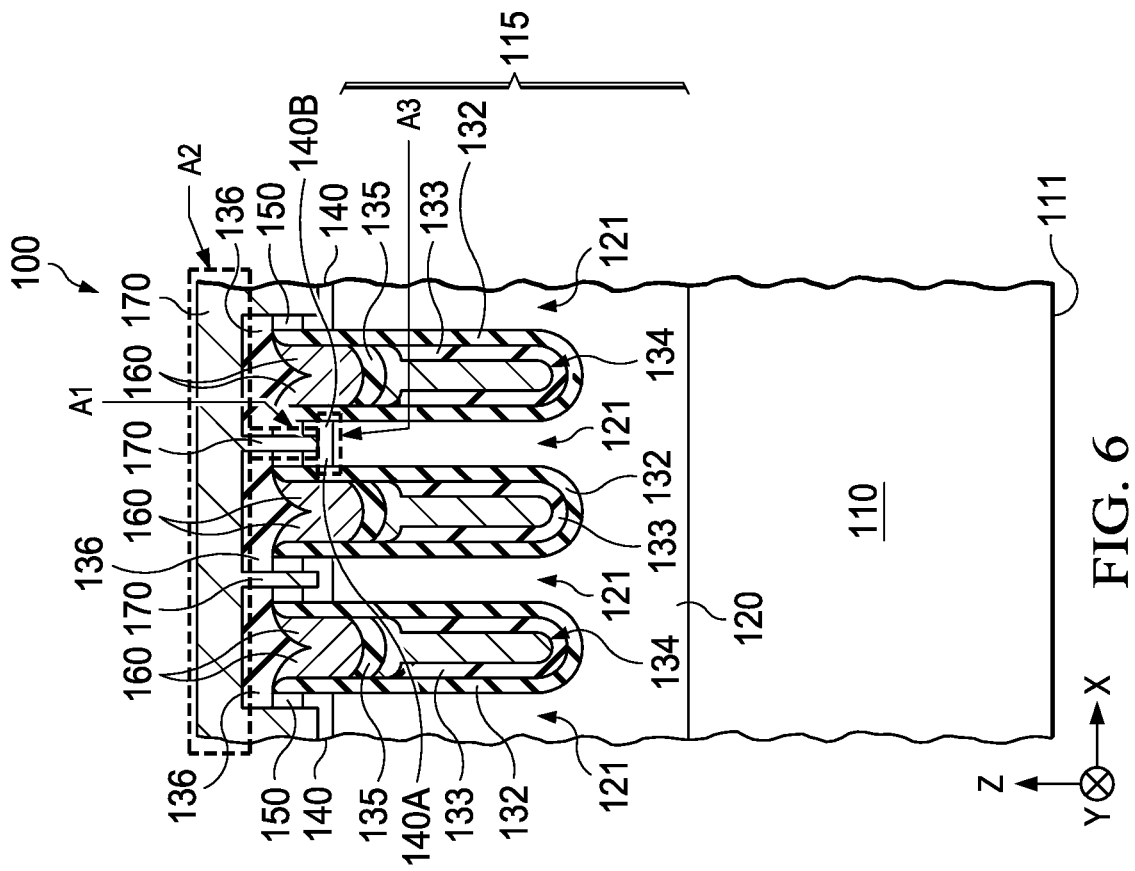

FIG. 6 illustrates an array of gates multiple gates 160, each gate 160 located over a corresponding one of the field plates 134, and source contacts 170, each source contact conductively connected to a corresponding one of the source regions 150. The gates 160 may be formed from polysilicon that is deposited as a single layer and etched back. FIG. 9 illustrates the corresponding steps as forming multiple gates 160 in the multiple trenches in step S706, and as forming source contacts 170 in contact with source regions in step S707.

In the example of FIG. 6, each source contact 170 is in contact with a corresponding source region 150 and a corresponding body structure 140. The source contacts 170 are in contact with one another by way of a metal layer over the top of the SG device to form an integral conducting member. The source contacts 170 include portions extending along the out-of-plane direction from the metal layer toward the body structures 140 (−Z direction along Z-axis) and conductively connected to the source regions 150 and the body structures 140 adjacent to the extended portions of the source contacts 170. The source contacts 170 may be formed by etching away a portion of each of the source regions 150, the body structures 140, and oxide layer 136 in areas A1. A refractory metal contact liner and metal such as aluminum may be deposited into the areas A1 and in the areas A2 above the areas A1. The source contacts 170 are conductively coupled to one another or integrated as one piece or an integral member by the metal layer in the area A2. In the example of FIG. 6, two side portions 140a and 140b of an example instance of a body structure 140 are physically connected by a bottom portion of the body structure 140 in an area A3. In other examples, body structures that touch a same contact 170 may be separated from each other by the contact 170.

With continued reference to FIG. 6, each gate 160 is conductively isolated from a corresponding body structure 140 by the oxide layer 132, which operates as a gate dielectric. FIG. 6 also illustrates oxide layers 135 between the field plates 134 and the gates 160, and oxide layers 136 on the gates 160.

Figures 7, 8:
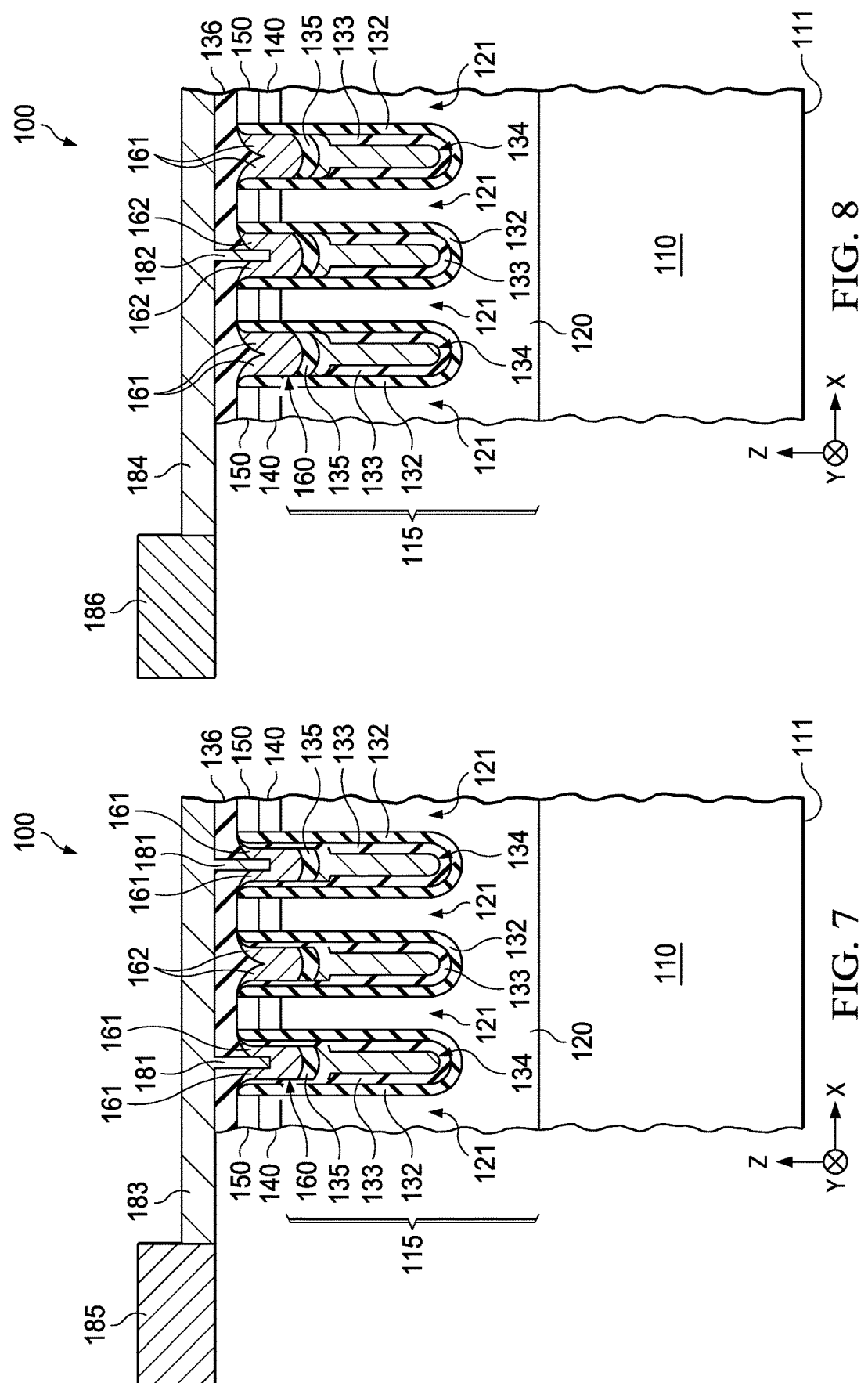

FIGS. 7 and 8 illustrate gate contacts that include a first group of gate contacts 181 and a second group of gate contacts 182. Further, a first gate bus 183 and a first gate pad 185 are coupled to the first group of gate contacts 181. A second gate bus 184 and a second gate pad 186 are coupled to the second group of gate contacts 182. FIG. 9 illustrates the corresponding steps as forming gate contacts that include first and second groups of gate contacts in step S708, and forming a first gate bus and a first gate pad coupled to the first group of gates in step S709, and forming a second gate bus and a second gate pad coupled to the second group of gates.

FIGS. 6 to 8 illustrate schematic views of an example SG device 100 according to described examples. For clear illustration purposes, not all structures of the SG device 100 are shown in each individual figure of FIGS. 6 to 8. For example, the SG device 100 includes the gate contacts (181, 182), which are not shown in FIG. 6, but are shown in FIGS. 7 and 8.

Referring to FIGS. 6 to 8, the SG device 100 includes the semiconductor substrate 110 that has a surface 111 and the semiconductor layer 120 including multiple semiconductor regions 121. The semiconductor substrate 110 may be heavily doped and may operate as a drain contact for the SG device 100. The semiconductor layer 120, which may be lightly doped, may operate as a drift region 115 of the SG device 100, where the drift region 115 of the SG device 100 includes a base drift region between the substrate 110 and the trenches 131, and the semiconductor regions 121. The SG device 100 further includes source regions 150 over the drift region 115, body structures 140 between the drift region 115 and respective source regions 150, and source contacts 170 in contact with respective source regions 150. As described above, the source contacts 170 may be coupled to one another to form an integral member. The SG device 100 further includes gates 160 corresponding to the body structures 140, a first group of gate contacts 181, and a second group of gate contacts 182, gate buses 183 and 184, and gate pad 185 and 186. The gates 160 include a first group of gates 161 and a second group of gates 162. The first group of gates 161 and gate contact 181 are coupled to the gate pad 185 via the gate bus 183, and the second group of gates 162 and gate contact 182 are coupled to the gate pad 186 via the gate bus 184. Accordingly, the first group of gates 161 is electrically isolated from the second group of gates 162, and the first group of gates 161 can be controlled separately with respect to the second group of gates 162.

Figure 10:
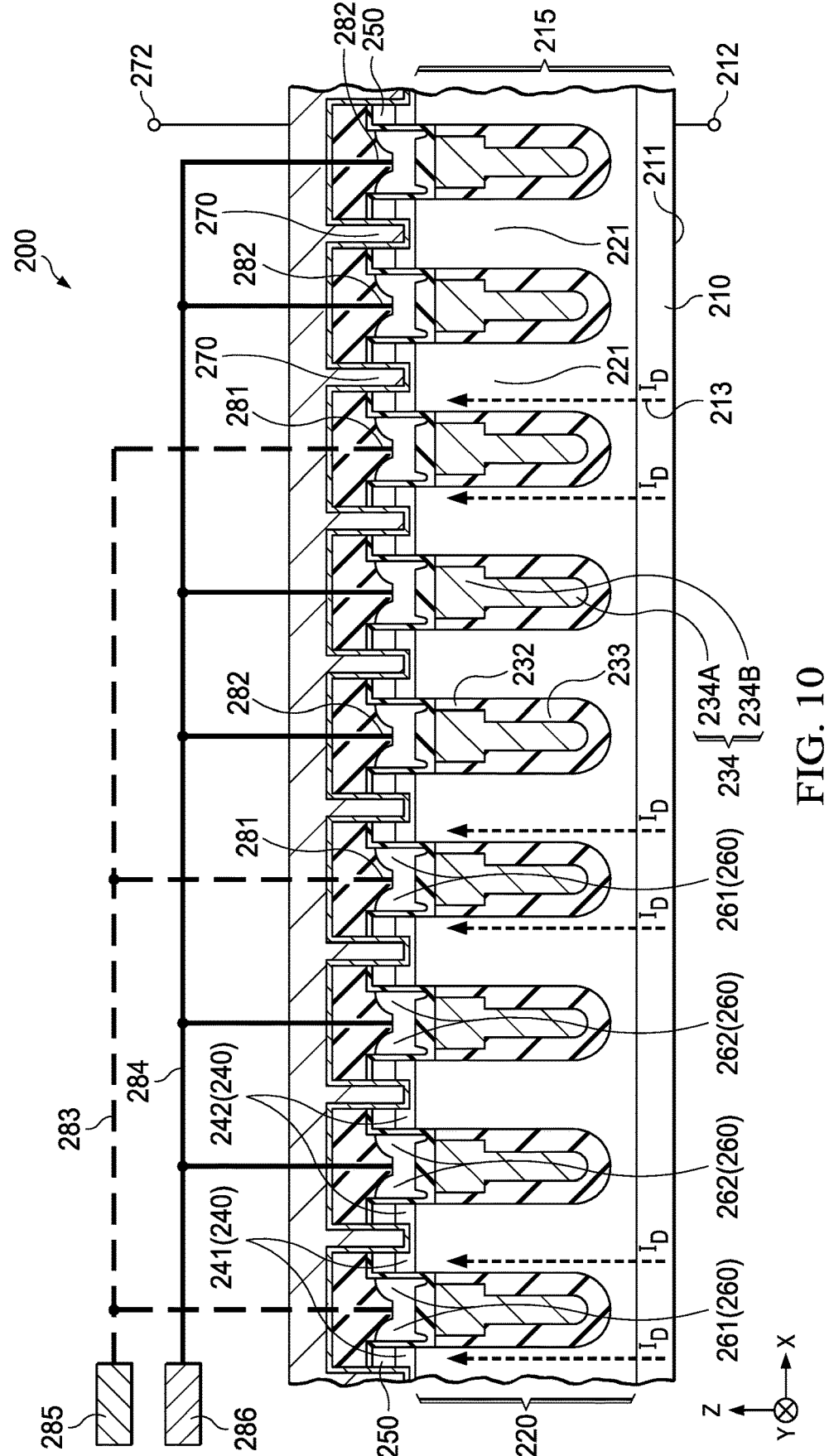
FIG. 10 illustrates a schematic view of another example SG device according to described examples.

FIG. 10 illustrates a schematic view of another example SG device 200 according to described examples. The SG device 200 includes a heavily doped semiconductor substrate 210 and a semiconductor layer 220 on the semiconductor substrate 210. The semiconductor layer 220 may be a lightly-doped epitaxial layer. Body structures 240, source regions 250, source contacts 270 overlie the semiconductor layer 220, and gate structures 260 are located between the body structures 240 and the source regions 250. The SG device 200 further includes gate contacts 281 and 282, gate buses 283 and 284, gate pads 285, 286, field plates 234, dielectric layers (e.g., 232, 233), a drain terminal 212, and a source terminal 272. The semiconductor substrate 210 has a surface 211. The semiconductor layer 220 includes multiple semiconductor regions 221. The semiconductor substrate 210 and the semiconductor layer 220 form a drift region 215 of the SG device 200, where the drift region 215 of the SG device 200 includes a base drift region, e.g., the semiconductor substrate 210, and multiple drift regions, e.g., semiconductor regions 221. The source regions 250 are over the drift region 215, and the body structure 240 is between the drift region 215 and the source region 250. The body structure 240 may be a semiconductor body region. The source contact 270 is in contact with a source region 170. The source contacts 270 are coupled to one another to form an integral member. The gate structure 260 corresponds to a body structure 240. Each gate structure 260 is viewed as providing two gates, corresponding to the two neighboring body structures 240. The gate structures 260 (e.g., an array of gates or a gate array) include a first proper subset of gates 261 and a second proper subset of gates 262. The gate contacts 281 and 282 includes a first group of gate contacts 281 in contact with the first proper subset of gates 261, and a second group of gate contacts 282 in contact with the second proper subset of gates 262.

The first proper subset of gates 261 and the first group of gate contacts 281 are coupled to the gate pad 285 via the gate bus 283, and the second proper subset of gates 262 and the second group of gate contacts 282 are coupled to the gate pad 286 via the gate bus 284. In some examples, the gate bus 283 and the gate bus 284 are arranged in a same layer that is parallel to the surface 211 of the semiconductor substrate 210. The first proper subset of gates 261 are electrically isolated/separated from the second proper subset of gates 262, and the first proper subset of gates 261 can be controlled separately with respect to the second proper subset of gates 262. The first gate pad 285 is configured to receive a first voltage; and the second gate pad 286 is configured to receive a second voltage. According to whether the first voltage received by the first gate pad 285 is less than a first threshold voltage of the first proper subset of gates 261, the first proper subset of gates 261 control channels of the first group of body structures 241. According to whether the second voltage received by the second gate pad 286 is equal to or larger than (e.g., reaches) a second threshold voltage of the second proper subset of gates 262, e.g., according to whether the second threshold voltage of the second proper subset of gates 262 is less than the second voltage received by the second gate pad 286, the second proper subset of gates 262 control channels of the second group of body structures 242. Thus, the channels of the first group of body structures 241 may be controlled separately with respect to the channels of the second group of body structures 242.

The body structures 240 include a first group of body structures 241 and a second group of body structures 242.

The gate structures 260 of the first proper subset of gates 261 each may be configured to control a channel of a body structure 241 of the first group of body structures 241; and the gate structures 260 of the second proper subset of gates 262 each may be configured control a channel of a body structure 242 of the second group of body structures 242. In some examples, the gate structures 260 and their corresponding channels of the body structures 240 extend in a direction orthogonal to the surface 211 of the semiconductor substrate 210.

In the example of FIG. 10, a ratio of a number of the first proper subset of gates 261 to a number of the second proper subset of gates 262 is 1:2. In some examples, a ratio of a number of the first group of gates to a number of the second group of gates is in a range of 1:100 to 1:1. A ratio of a number of the first group of gates to a number of the second group of gates may be chosen according to various application scenarios. A number of gates in the first proper subset of gates 261, and the number of gates in the second proper subset of gates 262 may be any value chosen according to various application scenarios.

In the example of FIG. 10, the gate structures 260 of the first proper subset of gates 261 and the gate structures 260 of the second proper subset of gates 262 are arranged along the in-plane direction (X-axis) such that the gate structures 260 of the second proper subset of gates 262 are grouped together according to the ratio of gates 261 to gates 262. Thus along the in-plane direction (X-axis), the gate structures 260 of the proper subset of gates 261 and the proper subset of gates 262 include two gates 261/four gates 262/two gates 261/four gates 262/two gates 261/four gates 262; and the ratio of numbers of the gates in the proper subset of gates 261 and the gates in the in the proper subset of gates 262 is or includes 2:4:2:4:2:4, which may also be considered as 1:2:1:2:1:2. In other examples, the ratio of the numbers of the gates 261 and gates 262 is or includes, e.g., 1:2:1:3:1: 2:1:3, 1:5:1:3:1:5:1:3, 2:1:2:1:2:1:2:1, 1:2:1:3:1:2:1:3:1:2:1: 3:1:2:1:3, etc. The ratio of the numbers of the gates 261 and 262 may be chosen according to various application scenarios.

The field plates 234 extend in a direction orthogonal to the surface 211 of the semiconductor substrate 210. Each field plate 234 includes a first portion 234a and a second portion 234b that has a larger in-plane (X-axis) dimension than the first portion 234a. The field plates 234 may be conductively connected to the source terminal 272, which is not shown in FIG. 10.

The drift regions 221 are on the base drift region 210. Each drift region 221 is located between adjacent field plates 234. The drift regions 221 extend in a direction (e.g., Z axis in FIG. 10) orthogonal to the surface 211 of the semiconductor substrate 210. The dielectric layers 232 electrically isolate the gate structures 260 from the body structures 240. The dielectric layers 232 and 233 electrically isolate the field plates 234 from drift regions 221 (e.g., semiconductor regions 221) and the base drift region 210 (e.g., the semiconductor substrate 210). The drain terminal 212 is coupled to the surface 211 of the semiconductor substrate 210. The source terminal 272 is coupled to source contacts 270.

In some examples, the semiconductor substrate 210 and the semiconductor regions 221 are of a first conductivity type (e.g., n-type); the body structures 240 include semiconductor regions of a second conductivity type (e.g., p-type); and the source regions 250 are semiconductor regions of the first conductivity type.

In some examples, a material of the gate 260 includes polycrystalline silicon, aluminum, or any other suitable materials; a material of the field plate 234 includes polycrystalline silicon, or any other suitable materials; and the source contact 270 includes a metal.

Figure 11:
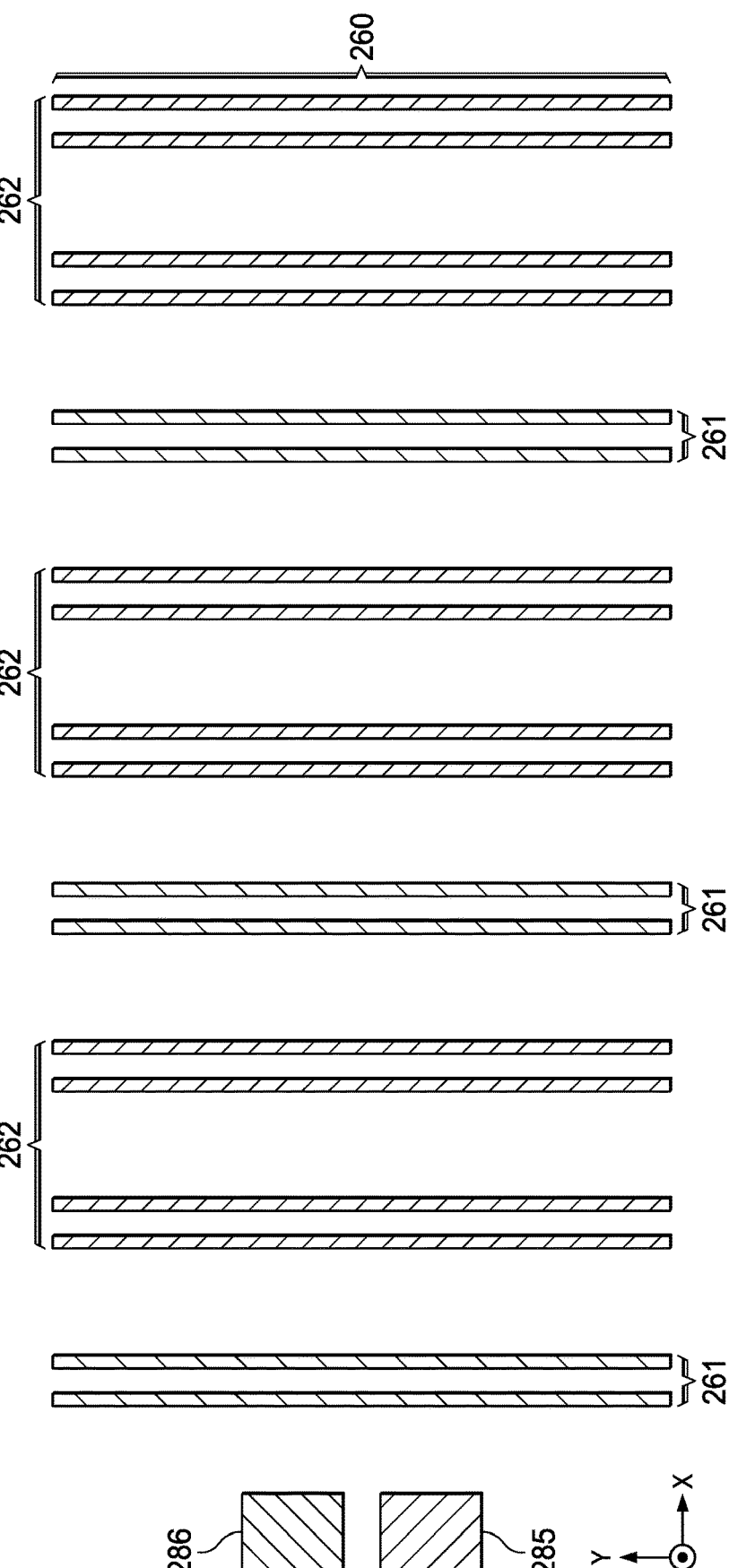
FIG. 11 illustrates a schematic view of an example SG configuration for the SG device of FIG. 10 according to described examples.

FIG. 11 illustrates a schematic view of an example SG configuration for the SG device 200 in FIG. 10 according to described examples. Referring to FIG. 11, the gates 260 include a first proper subset of gates 261 and a second proper subset of gates 262. The gates 260 are split into two proper subsets of gates 261, 262. The first proper subset of gates 261 and the second proper subset of gates 262 extend along an in-plane direction (e.g., Y axis in FIG. 11). The first proper subset of gates 261 may be coupled to the gate pad 285, and the second proper subset of gates 262 may be coupled to the gate pad 286.

Figures 12, 13:
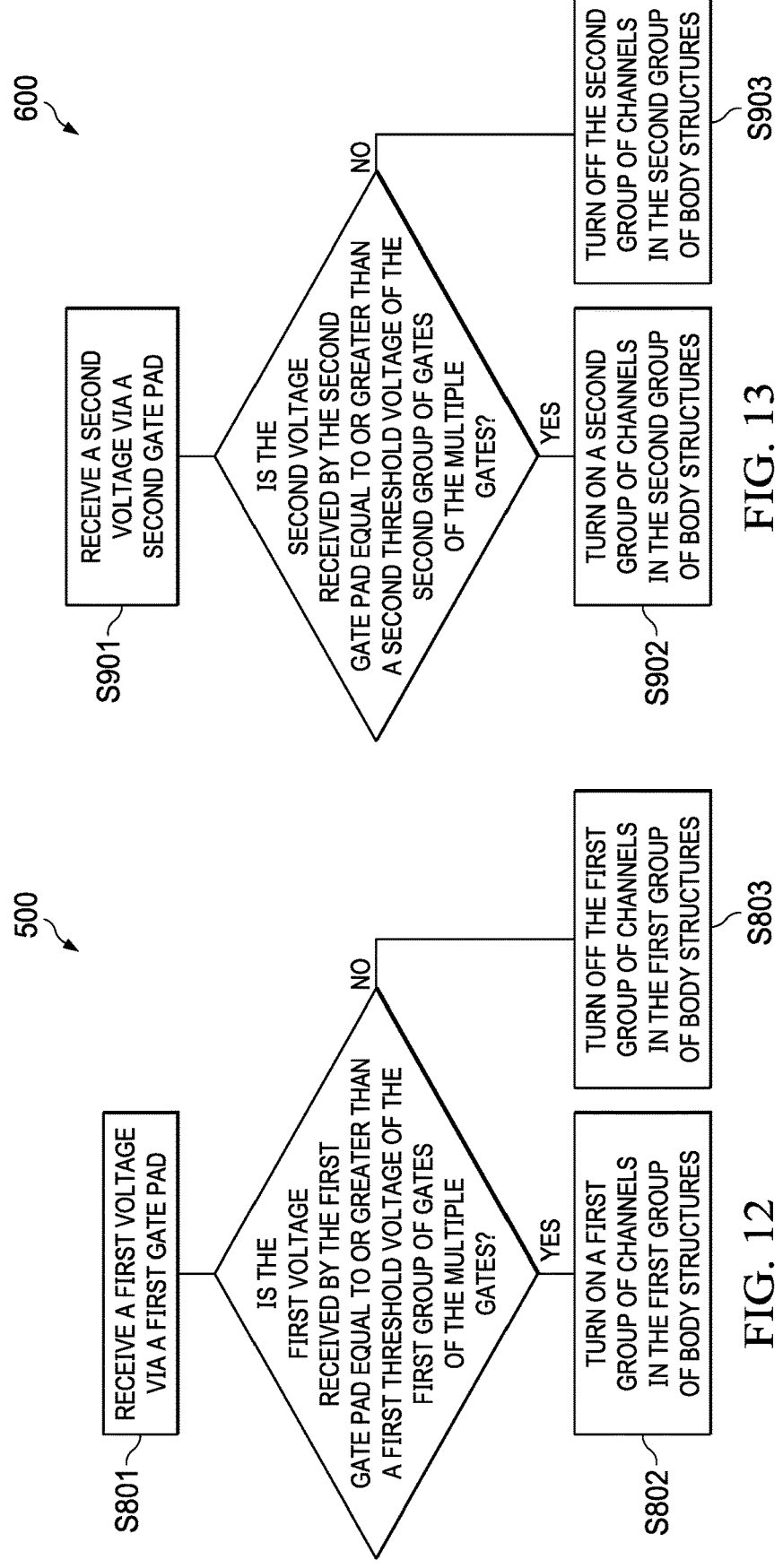
FIG. 12 illustrates a flow chart of an example operation method according to described examples.
FIG. 13 illustrates a flow chart of another example operation method according to described examples.

FIGS. 12 and 13 illustrate flow charts of example operation methods 500 and 600 for an example SG device. The example operation methods 500 and 600 are described below with reference to the SG device 200 in FIG. 10 as an example. However, the operation methods 500 and 600 can be performed on or by other suitable SG devices consistent with the present disclosure.

Referring to FIG. 12, the method 500 is illustrated, At S801, a first voltage is received via the first gate pad. In some examples, the first gate pad 285 receives the first voltage.

At S802, in response to the first voltage received by the first gate pad being equal to or greater than a first threshold voltage of the first group of gates of the multiple gates, a first group of channels of the first group of body structures are turned on by the first group of gates. For example, in response to the first voltage received by the first gate pad 285 being equal to or greater than a first threshold voltage of the first proper subset of gates 261, a first group of channels of the first group of body structures 241 are turned on; and electrical currents (ID) 213 corresponding to the first group of channels that are turned on flow in the SG device 200. The first threshold voltage of the first group of gates of the multiple gates may be a threshold voltage that is required by the first group of gates to turn on the first group of channels corresponding to the first group of gates.

At S803, in response to the first voltage received by the first gate pad being less than the first threshold voltage of the first group of gates of the multiple gates, the first group of channels in the first group of body structures is turned off by the first group of gates. For example, in response to the first voltage received by the first gate pad 285 being less than the first threshold voltage of the first proper subset of gates 261 of the multiple gates 260, the first group of channels in the first group of body structures 241 is turned off.

Referring to FIG. 13, the method 600 is illustrated. At S901, a second voltage is received via the second gate pad. For example, the second gate pad 286 receives the second voltage.

At S902, in response to the second voltage received by the second gate pad being equal to or greater than a second threshold voltage of the second group of gates of the multiple gates, a second group of channels of the second group of body structures are turned on by the second group of gates. For example, in response to the second voltage received by the second gate pad 286 being equal to or greater than the second threshold voltage of the second proper subset of gates 262 of the multiple gates 260, a second group of channels in the second group of body structures 242 are turned on. The second threshold voltage of the second group of gates of the multiple gates may be a threshold voltage that is required by the second group of gates to turn on the second group of channels corresponding to the second group of gates. In some examples, the second threshold voltage of the second group of gates is equal to the first threshold voltage of the first group of gates.

At S903, in response to the second voltage received by the second gate pad being less than the second threshold voltage of the second group of gates of the multiple gates, the second group of channels in the second group of body structures is turned off. For example, in response to the second voltage received by the second gate pad 286 being less than the second threshold voltage of the second proper subset of gates 262 of the multiple gates 260, the second group of channels in the second group of body structures 242 is turned off.

In some examples, such as examples of the SG device 200 operating in a low power region or a linear region, the first proper subset of gates 261 are configured to, in response to the first voltage received by the first gate pad 285 being equal to or greater than the first threshold voltage of the first proper subset of gates 261 of the multiple gates 260, turn on the first group of channels in the first group of body structures 241; and the second proper subset of gates 262 are configured to, in response to the second voltage received by the second gate pad 286 being equal to or greater than the second threshold voltage of the second proper subset of gates 262 of the multiple gates 260, turn on the second group of channels in the second group of body structures 242. Accordingly, in response to the first voltage being equal to or greater than the first threshold voltage and the second voltage being equal to or greater than the second threshold voltage, the first and second proper subsets of gates 261 and 262 may be turned on, and the SG device 200 may operate in an operation mode with a same on-resistance (Ron) as, e.g., a MOSFET device without split-gate.

In some other examples, such as examples of the SG device 200 operating in a high power region, the first proper subset of gates 261 are configured to, in response to the first voltage received by the first gate pad 285 being less than the first threshold voltage of the first proper subset of gates 261 of the multiple gates 260, turn off the first group of channels in the first group of body structures 241; and the second proper subset of gates 262 are configured to, in response to the second voltage received by the second gate pad 286 being equal to or greater than the second threshold voltage of the second proper subset of gates 262 of the multiple gates 260, turn on the second group of channels in the second group of body structures 242. Accordingly, in response to the first voltage being less than the first threshold voltage and the second voltage being equal to or greater than the second threshold voltage, the first proper subset of gates 261 may be turned off, and the second proper subset of gates 262 may be turned on, and the SG device 200 may operate in an operation mode with ⅔ of the gates 260 on and ⅓ of the gates off. As compared to the scenarios that the gates 260 and corresponding channels are on, the number of channels being on is reduced, and the zero-temperature-coefficient point may be lowered. Influence of drift resistance of the SG device 200 may be enhanced by reducing the influence of channel portion which makes current increases as temperature increases due to threshold voltage being reduced as temperature goes up; and the SOA of the SG device 200 may be improved.

In some other examples, such as examples of the SG device 200 operating in a high power region, the first proper subset of gates 261 are configured to, in response to the first voltage received by the first gate pad 285 being equal to or greater than the first threshold voltage of the first proper subset of gates 261 of the multiple gates 260, turn on the first group of channels in the first group of body structures 241; and the second proper subset of gates 262 are configured to, in response to the second voltage received by the second gate pad 286 being less than the second threshold voltage of the second proper subset of gates 262 of the multiple gates 260, turn off the second group of channels in the second group of body structures 242. Accordingly, in response to the first voltage being equal to or greater than the first threshold voltage and the second voltage being less than the second threshold voltage, the first proper subset of gates 261 may be turned on, and the second proper subset of gates 262 may be turned off, and the SG device 200 may operate in an operation mode with ⅓ of the gates 260 on and ⅔ of the gates 260 off. As compared to the scenarios that the gates 260 and corresponding channels are on, the number of channels that are on may be reduced, and the zero-temperature-coefficient point may be lowered. Influence of drift resistance of the SG device 200 may be enhanced as compared to influence of channels; and the SOA of the SG device 200 may be improved.

In some examples, the SOA of a SG device consistent with present disclosure may be improved by a factor in a range of approximately 1 to 100, depending on split gate ratio.

FIG. 14 illustrates a flow chart of another example operation method 700 according to described examples. Certain processes of the operation method 700 are the same as or similar to processes of above-described methods, e.g., example methods 500 and 600, and references can be made to the descriptions of the above-described methods.

At 951, a first voltage is received via the first gate pad. In some examples, the first gate pad 285 of the SG device 200 receives the first voltage.

At S952, a second voltage is received via the second gate pad. For example, the second gate pad 286 receives the second voltage.

At S953, in response to that the first voltage received by the first gate pad is equal to or greater than a first threshold voltage of the first proper subset of gates (e.g., 261) of the multiple gates and that the second voltage received by the second gate pad is equal to or greater than a second threshold voltage of the second proper subset of gates 262 of the multiple gates 260, a first group of channels in the first group of body structures (e.g., 241) are turned on by the first group of gates and a second group of channels in the second group of body structures (e.g., 242) are turned on by the second group of gates. Accordingly, the on-resistance of the device 200 may be reduced, with the first and second proper subsets of gates 261 and 262 of the device 200 being on.

At S954, in response to that the first voltage received by the first gate pad is equal to or greater than the first threshold voltage of the first proper subset of gates 261 of the multiple gates and that the second voltage received by the second gate pad is less than the second threshold voltage of the second proper subset 262 of the multiple gates, the first group of channels in the first group of body structures (e.g., 241) are turned on by the first group of gates, and the second group of channels in the second group of body structures (e.g., 242) are turned off by the second group of gates. Accordingly, the SOA of the device 200 may be improved, with the first proper subset of gates 261 of the device 200 being on and the second proper subset of gates 262 of the device 200 being off.

The response of the method 700 at S954 may be particularly beneficial in some operating conditions, such as when a short-circuit is present at the drain 212 of the SG device 200. By turning on only a proper subset of the channels (e.g.

conducting through only a proper subset of the body structures, 240), the drift resistance temperature coefficient may become dominant, lower the power density of the SG device 200 and lowering the ZTC. This reduced ZTC may increase the SOA of the SG device 200 by as much as four times that of a similar transistor for which all the channels operate together. Thus the potential for thermal runaway of the SG device 200 is reduced, improving reliability and/or reducing the possibility of device failure.

In the present disclosure, the terms "turn on" or the like may refer to causing to be at an on status from an off or on status; and the terms "turn off" or the like may refer to causing to be at an off status from an off or on status. Processes/steps in the methods consistent with the present disclosure, such as the above-described methods 500, 600, and 700 may be combined, omitted, or modified within the scope of the present disclosure.

For example, at a first time point, in response to that the first voltage received by the first gate pad is equal to or greater than a first threshold voltage of the first proper subset of gates 261 of the multiple gates and that the second voltage received by the second gate pad is equal to or greater than a second threshold voltage of the second proper subset of gates 262 of the multiple gates, a first group of channels in the first group of body structures (e.g., 241) are turned on by the first group of gates and a second group of channels in the second group of body structures (e.g., 242) are turned on by the second group of gates; and at a second time point (e.g., a time point that is after the first time point or a time point that is before the first time point), in response to that the first voltage received by the first gate pad is equal to or greater than the first threshold voltage of the first proper subset of gates 261 of the multiple gates and that the second voltage received by the second gate pad is less than the second threshold voltage of the second proper subset of gates 262) of the multiple gates, the first group of channels in the first group of body structures (e.g., 241) are turned on by the first group of gates, and the second group of channels in the second group of body structures (e.g., 242) are turned off by the second group of gates.

Modifications, additions, or omissions may be made to the systems, apparatuses, and methods described herein without departing from the scope of the disclosure. Moreover, the operations of the systems and apparatuses disclosed herein may be performed by including more, fewer, or other components; and the methods described may include more, fewer, or other steps. Additionally, steps may be performed in any suitable order.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:
1. A semiconductor device, comprising:
a first trench, a second trench, and a plurality of third trenches formed in a semiconductor layer having a first conductivity type and being noncontiguous with respect to each other, the third trenches located between the first trench and the second trench, each trench including a corresponding field plate, and each third trench directly neighboring at least one other third trench;

a first gate located over the first trench, a second gate located over the second trench, and a plurality of third gates each located over corresponding ones of the third trenches;

a first body region having an opposite second conductivity type extending from the first trench to a first one of the third trenches, a second body region having the second conductivity type extending from the second trench to a second one of the third trenches, and a third body region having the second conductivity type extending from one of an adjacent pair of the third trenches to another of the adjacent pair of the third trenches;

a first source region over the first body region, a second source region over the second body region, and a third source region over the third body region, the first, second and third source regions having the first conductivity type; and a first gate bus conductively connected to the first gate and the second gate, and a second gate bus conductively connected to the plurality of third gates, the first gate bus conductively isolated from the second gate bus.

2. The semiconductor device of claim 1, wherein the first and second source regions are conductively connected to a same source terminal.

3. The semiconductor device of claim 1, further comprising:

a first gate pad conductively connected to the first gate bus; and a second gate pad conductively connected to the first gate bus.

4. The semiconductor device of claim 1, further comprising a heavily doped layer touching the semiconductor layer, the heavily doped layer configured to provide a drain contact.

5. The semiconductor device of claim 1, wherein the first gate is a gate of a first field-effect transistor (FET), and the third gate is a gate of a second FET, the first FET is one of a plurality of FETs in a first proper subset of FETs and the second FET is one of a plurality of FETs in a second proper subset of FETs, each FET having an associated gate, and the gates of the first proper subset of FETs are connected to the first gate bus, and the gates of the second proper subset of FETs are connected to the second gate bus.

6. The semiconductor device of claim 5, wherein:

a ratio of a number of the first proper subset of FETs to a number of the second proper subset of FETs is in a range of 1:100 to 1:1.

7. The semiconductor device of claim 6, wherein the ratio of the number of the first proper subset of FETs to the number of the second proper subset of FETs is 1:2.

8. The semiconductor device of claim 1, wherein the field plates are conductively connected to the source regions.

9. A semiconductor device, comprising:

a drift region having a first surface;

first and second source regions, and a plurality of third source regions, located over the drift region and being electrically connected to a source terminal;

a first body structure between the first source region and the drift region;

a second body structure between the second source region and the drift region;

a plurality of third body structures each located between a corresponding one of the third source regions and the drift region; and a first gate corresponding to the first body structure, a second gate corresponding to the second body structure, and a plurality of third gates each corresponding to one of the third body structures, each third gate directly neighboring at least one other third gate, wherein the first gate and the second gate are conductively connected to a first gate signal node configured to receive a first voltage, the first, second and third gates being noncontiguous with respect to each other, and having short axes in a first direction and long axes in a second direction, the short axes being colinear along the first direction; and the third gates are conductively connected to a second gate signal node configured to receive a second voltage.

10. The semiconductor device of claim 9, wherein:

the first and second gates are configured to, in response to the first voltage received by the first gate signal node being equal to or greater than a first threshold voltage of the first and second gates, turn on channels in the first and second body structures; and the third gates are configured to, in response to the second voltage received by the second gate signal node being equal to or greater than a second threshold voltage of the third gates, turn on channels of the third body structures.

11. The semiconductor device of claim 9, wherein:

the first and second gates are configured to, in response to the first voltage received by the first gate signal node being equal to or greater than a first threshold voltage of the first and second gates, turn on channels in the first and second body structures; and the third gates are configured to, in response to the second voltage received by the second gate signal node being less than a second threshold voltage of the third gates, turn off channels of the third body structure.

12. The semiconductor device of claim 9, wherein:

the first and second gates are configured to, in response to the first voltage received by the first gate signal node being equal to or greater than a first threshold voltage of the first and second gates, turn off channels in the first and second body structures; and the third gates are configured to, in response to the second voltage received by the second gate signal node being less than a second threshold voltage of the third gates, turn off channels of the third body structure.

13. The semiconductor device of claim 9, wherein a first threshold voltage of the first and second gates is equal to a second threshold voltage of the third gates.

14. The semiconductor device of claim 9, wherein the first and second gates are configured to:

at a first time point, in response to the first voltage received by the first gate signal node being equal to or greater than a first threshold voltage of the first and second gates and the second voltage received by the second gate signal node being equal to or greater than a second threshold voltage of the third gates, turn on a first channel in the first body structure by the first gate, and turn on a second channel of the one or more of the third body structures by the third gates; and at a second time point, in response to the first voltage received by the first gate signal node being equal to or greater than the first threshold voltage of the first gate and the second voltage received by the second gate signal node being less than the second threshold voltage of the third gates, turn on the first channel in the first body structure by the first gate, and turn off the second channel of the one or more of the third body structures by the third gates.

15. A method of forming a semiconductor device, comprising:

forming a first trench, a second trench, and a plurality of third trenches in a semiconductor layer of a first conductivity type, each of the trenches being noncontiguous with respect to each other;

forming corresponding oxide layers over inner walls of the first, second and third trenches;

forming a first polysilicon plate in the first trench, a second polysilicon plate in the second trench, and corresponding third polysilicon plates in the third trenches;

forming a first gate over the first polysilicon plate, a second gate over the second polysilicon plate and corresponding third gates over the third polysilicon plates;

forming first and second body structures of a second conductivity type over the semiconductor layer, the first body structure extending from the first trench to a first one of the third trenches and the second body structure extending from the second trench to a second one of the third trenches;

forming a third body structure extending from a first one of the third trenches to a second one of the third trenches;

forming a first source region of the first conductivity type over the first body structure, a second source region of the first conductivity type over the second body structure and corresponding third source regions of the first conductivity type over the third body structures;

conductively connecting the first and second gates to a first gate signal node; and conductively connecting the third gates to a second gate signal node conductively isolated from the first gate signal node.

16. The method of claim 15, wherein:

the first gate signal node is connected to first and second gate contacts that are in contact with the first and second gates; and the second gate signal node is connected to third gate contacts that are in contact with the third gates.

17. The method of claim 15, further comprising:

forming a first source contact in contact with the first source region, a second source contact in contact with the second source region, and third source contacts in contact with the third source regions, the first, second and third source contacts being conductively connected to a same source terminal.

18. An integrated circuit, comprising:

a plurality of trenches formed in a semiconductor substrate having a first conductivity type, including a first trench, a second trench and a plurality of third trenches between the first and second trenches, each of the trenches being noncontiguous with respect to each other;

a first field plate within the first trench, a second field plate within the second trench and third field plates within the third trenches;

a first gate structure over the first field plate, a second gate structure over the second field plate and third gate structures over the third field plates;

a first source region extending from the first trench to a first one of the third trenches, a second source region extending from the second trench to a second one of the third trenches, and a third source region extending from two adjacent ones of the third trenches;

a source node connected to the first, second and third source regions;

a first gate node connected to the first and second gate structures; and a second gate node connected to the two adjacent ones of the third gate structures and conductively isolated from the first and third gate structures.

19. The integrated circuit of claim 18, further comprising a fourth trench between the first trench and the third trenches, and a fourth gate structure within the fourth trench and connected to the second gate node.

* * * * *